(12) United States Patent
Rathmell et al.

(10) Patent No.: US 7,022,984 B1
(45) Date of Patent: Apr. 4, 2006

(54) BIASED ELECTROSTATIC DEFLECTOR

(75) Inventors: Robert D. Rathmell, Murphy, TX (US); Bo H. Vanderberg, Gloucester, MA (US); Youngzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 11/047,238

(22) Filed: Jan. 31, 2005

(51) Int. Cl.
*H01J 40/00* (2006.01)
*H01J 47/00* (2006.01)
*G21G 51/00* (2006.01)

(52) U.S. Cl. .................................... 250/305; 250/492.1
(58) Field of Classification Search ................ 250/305
See application file for complete search history.

(56) References Cited

U.S. PATENT DOCUMENTS 4,959,544 A * 9/1990 Sukenobu .................. 250/305
6,573,517 B1 * 6/2003 Sugitani et al. ......... 250/492.21

* cited by examiner

*Primary Examiner*—John R. Lee
*Assistant Examiner*—Jennifer Yantomo
(74) *Attorney, Agent, or Firm*—Eschweiler & Associates, LLC

(57) ABSTRACT

Angular electrostatic filters and methods of filtering that remove energy contaminants from a ribbon shaped ion beam are disclosed. An angular electrostatic filter comprises a top deflection plate and a bottom deflection plate extending from an entrance side to an exit side of the filter. The bottom deflection plate is substantially parallel to the top deflection plate and includes an angle portion. An entrance focus electrode is positioned on the entrance side of the filter and an exit focus electrode is positioned on the exit side of the filter and both serve to focus the ion beam. Edge electrodes are positioned between the top and bottom deflection plates and at sides of the filter to mitigate edge effects. A negative bias is also applied to the top and bottom plates to mitigate space charge by elevating the beam energy.

19 Claims, 11 Drawing Sheets

BIASED ELECTROSTATIC DEFLECTOR

FIELD OF THE INVENTION

The present invention relates generally to ion implantation systems, and more particularly to a biased electrostatic deflector that selectively removes energy contaminants from an ion beam.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam of desired energy. The ion beam is then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. The ion energy is used to control junction depth in semiconductor devices, where the energy levels of the beam ions determine the degree to which ions are implanted or the depth of the implanted ions. The continuing trend toward smaller and smaller semiconductor devices requires a mechanism, which serves to deliver high beam currents at low energies. The high beam current provides the necessary dosage levels, while the low energy permits shallow implants.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed towards an angular energy filter that employs biased electrostatic deflectors to mitigate or remove energy contaminants from a generated ion beam. The angular energy filter employs the biased electrostatic deflectors to select a specific energy of ions and exclude non-selected energies from reaching a target.

Angular deflectors and methods of filtering that remove energy contaminants from a ribbon shaped ion beam are provided. In one aspect, an angular electrostatic filter comprises a top deflection plate and a bottom deflection plate extending from an entrance side to an exit side of the filter. The bottom deflection plate is substantially parallel to the top deflection plate and includes an angle portion. An entrance focus electrode is positioned on the entrance side of the filter and an exit focus electrode is positioned on the exit side of the filter and both serve to focus the ion beam. Edge electrodes are positioned between the top and bottom deflection plates and at sides of the filter to mitigate edge effects. Other filters, assemblies, and methods are provided.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
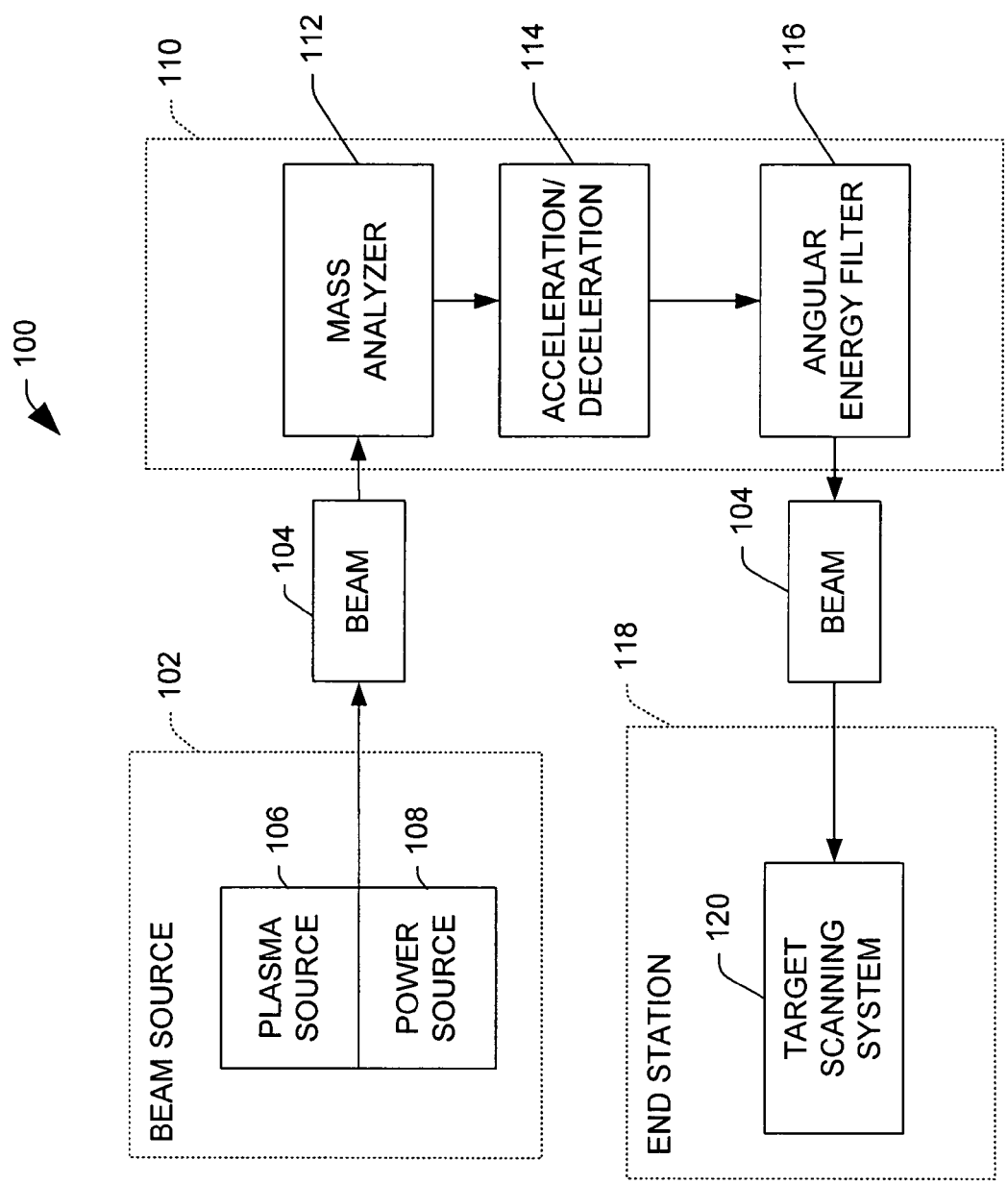
FIG. 1 is a schematic block diagram illustrating components of an ion implantation system in accordance with one or more aspects of the present invention.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

Many ion implantations performed in current semiconductor fabrication processes are shallow and/or ultra-shallow implants that form shallow and/or ultra-shallow junction depths in formed devices. These shallow and/or ultra-shallow implants typically employ low energies (e.g., 1 keV), but require relatively high beam current. Generally, it is appreciated that high current low energy ion beams are obtained by extracting the ion beam from an ion source at a relatively high energy. Then, the ion beam is mass purified and transported to a position relatively close to a target wafer. Subsequently, the ion beam is decelerated to a selected low energy level and is then transported to the target wafer. However, the ion beam can include energy contaminants that are unaffected by the deceleration and, therefore, penetrate target wafers deeper than desired. As a result, the energy contaminants can damage underlying components and/or other portions of the target wafer, resulting in a potential loss of process control.

The present invention facilitates ion implantation by mitigating or removing energy contaminants from ion beams, and particularly low energy ion beams. An ion implantation system of the present invention employs an angular energy filter that mitigates or removes the energy contaminants from a generated ion beam. The angular energy filter employs biased electrostatic deflectors to select a specific energy of ions and exclude non-selected energies from reaching a target. A path of the selected ions is altered by a selected angle and the selected ions pass through a slit or opening towards a target wafer. Path(s) for energy contaminants are not altered by the selected angle and, therefore, do not generally pass through the slit or opening towards the target wafer.

One mechanism for removing energy contaminants is to apply a voltage potential between two infinitely sized parallel plates that, as a result of being infinite, can generate a perfectly uniform electric field there between. However, such sized plates are not feasible and deflection plates of limited sizes are, therefore, employed. These deflection plates of limited size result in electric fields that are substantially non-uniform near edges of the plates resulting in undesired horizontal and edge focusing. As a result, the plates can undesirably operate as a dipole lens. The present invention employs a bottom deflection plate with an angled portion, edge electrodes, entrance focus electrodes, and/or exit focus electrodes in order to compensate for edge focusing effects.

Referring initially to FIG. 1, an ion implantation system 100 suitable for implementing one or more aspects of the present invention is depicted in block diagram form. The system 100 includes an ion source 102 for producing an ion beam 104 along a beam path. The ion beam source 102 includes, for example, a plasma source 106 with an associated power source 108. The plasma source 106 may, for example, comprise a relatively long plasma confinement chamber from which an ion beam is extracted.

A beamline assembly 110 is provided downstream of the ion source 102 to receive the beam 104 therefrom. The beamline assembly 110 includes a mass analyzer 112, an acceleration structure 114, which may include, for example, one or more gaps, and an angular energy filter 116. The beamline assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., charge to mass ratio). Ions traveling through the magnetic field experience a force which directs individual ions of a desired mass along the beam path and which deflects ions of undesired mass away from the beam path.

The acceleration gap or gaps within the acceleration structure 114 are operable to accelerate and/or decelerate ions within the beam to achieve a desired depth of implantation in a workpiece. Accordingly, it will be appreciated that while the terms accelerator and/or acceleration gap may be utilized herein in describing one or more aspects of the present invention, such terms are not intended to be construed narrowly so as to be limited to a literal interpretation of acceleration, but are to be construed broadly so as to include, among other things, deceleration as well as changes in direction. It will be further appreciated that acceleration/deceleration means may be applied before as well as after the magnetic analysis by the mass analyzer 112.

It is appreciated that contaminating particles, also referred to as energy contaminants, include neutral and/or other non-selected energy ranges, may be produced within the ion beam 104 by collisions among ions and background or residual particles. Such encounters can cause some of the ions to exchange charges with the background or other particles thereby becoming neutral particles or contaminants. These neutral particles can be implanted onto the wafer in areas that are to be doped with ions, thereby diluting the intended level of doping and adversely affecting the doping process. More importantly, because these particles are electrically neutral they can pass through the accelerator, and more particularly through electrostatic fields generated by the electrodes unaffected (e.g., without being accelerated, decelerated, focused, bent or otherwise altered in speed and/or direction). As such, these particles can be implanted into the wafer at undesired depths as their (unaffected) energy levels will likely differ from the energy levels of the bent, focused, accelerated and/or decelerated ions in the ion beam that have passed through and been adjusted by the accelerator. This neutral particle contamination can severely degrade the desired performance of resulting semiconductor devices.

An angular energy filter 116 receives the accelerated/decelerated ions from the acceleration gap(s) 114 and selects ions within a specific energy range and excludes contaminating particles, including neutrals and ions having other energies, from the ion beam 104. The angular energy filter 116 employs deflection plates, focusing electrodes, and edge electrodes, discussed infra, to alter a path of ions within the specific energy range and allows those ions to pass through a slit or aperture. Otherwise, the non-selected ions do not pass through the slit and are thereby prevented from contaminating the wafer. The deflection plates cause the selected ions to be deflected at a selected angle (e.g., about 5 to 25 degrees) from the path of the energy contaminants, which also happens to be the original path of the ion beam 104 as the neutral energy contaminants are unaffected by the deflection plates since the contaminants are electrically neutral. The beam of ions is directed onto the workpiece to encounter select areas of the workpiece to be doped. It will be appreciated that some type of barrier can, for example, be placed in front of the stream of energy contaminants to prevent the contaminants from encountering the workpiece or wafer.

The angular energy filter 116 also mitigates beam blow up, which occurs as a result of the repulsive properties of like charged particles. Positively charged ions which form the ion beam repulse each other because of a so-called "space-charge force". Space-charge effects increase with decreasing ion beam energy, and thus may increase as the ions in the beam are decelerated, making the beam more prone to dispersal or blow up. Because of the space-charge force, the lateral spread of an ion beam is proportional to:

$$(\sqrt{m}/\sqrt{q}) \times (Iz^2/U^{3/2})$$

where m is an ion mass, q is an ion charge, I is a beam current, U is beam energy, and z is the traveling distance of the ion beam, assuming that the ion beam is uniform and has a circular cross section. Thus, it can be appreciated that the likelihood of beam blow up increases as the distance that the beam travels increases. Accordingly, if an ion beam travels over a long distance to a wafer, it becomes more difficult for all ions to reach the wafer, particularly where the beam is decelerated and there is a large beam current or concentration of ions within the beam. The angular energy filter 116 mitigates beam blow up by arranging/configuring the deflection plates and other electrodes within the angular energy filter 116 so as to reduce the distance that the ion beam 104 has to travel to reach the target and by focusing the ion beam 104 to oppose space charge induced beam dispersion and by allowing the beam to maintain a somewhat higher energy, which reduces the space charge forces while in the presence of electrostatic fields.

An end station 118 is also provided in the system 100 to receive the mass analyzed decontaminated ion beam 104 from the beamline assembly 110. The end station 118 supports one or more workpieces such as semiconductor wafers (not shown) along the beam path for implantation using the mass analyzed decontaminated ion beam 104. The end station 118 includes a target scanning system 120 for translating or scanning one or more target workpieces and the ion beam 104 relative to one another. The target scanning system 120 may provide for batch or serial implantation, for example, as may be desired under given circumstances, operating parameters and/or objectives.

Figure 2:
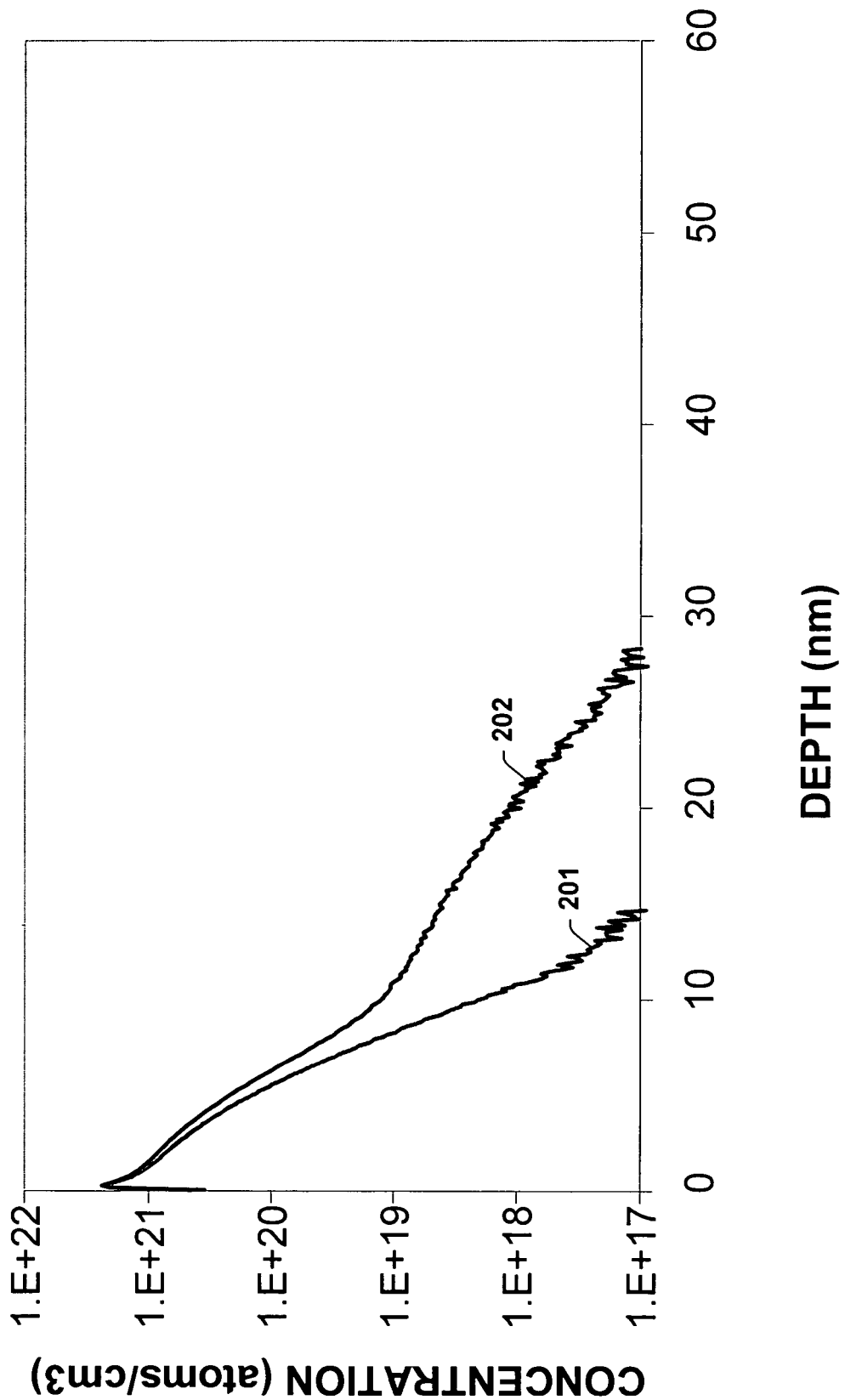
FIG. 2 is a graph illustrating energy contamination for ion implantation.

FIG. 2 is a graph illustrating exemplary energy contamination for ion implantation. The graph compares ion beams with known energy contamination with an ion beam without substantial energy contamination, such as one filtered with an angular energy filter of the present invention. The values of the graph were obtained using secondary ion mass spectroscopy (SIMS).

An x-axis depicts depth from a surface of a target wafer and a y-axis represents measured dopant concentration. The ion implantations performed to obtain the graph were 0.5 keV B+ implants. Line 201 depicts measured dopant concentration for an ion implantation relatively free of energy contaminants that may be obtained using an angular electrostatic deflector of the present invention. Line 202 depicts measured dopant concentrations for an implant done in the conventional way in which there is no deflection to eliminate energy contamination after decel and there is a significant drift length prior to the decel gap in which charge exchange collisions can lead to neutrals at a higher energy.

By comparing lines 201 and 202, it is noted that energy contamination has resulted in a noticeable difference in dopant concentration. This difference is the result of the energy contaminants being implanted and being implanted with energies exceeding the desired 0.5 keV of the B+ ions.

Figure 3:
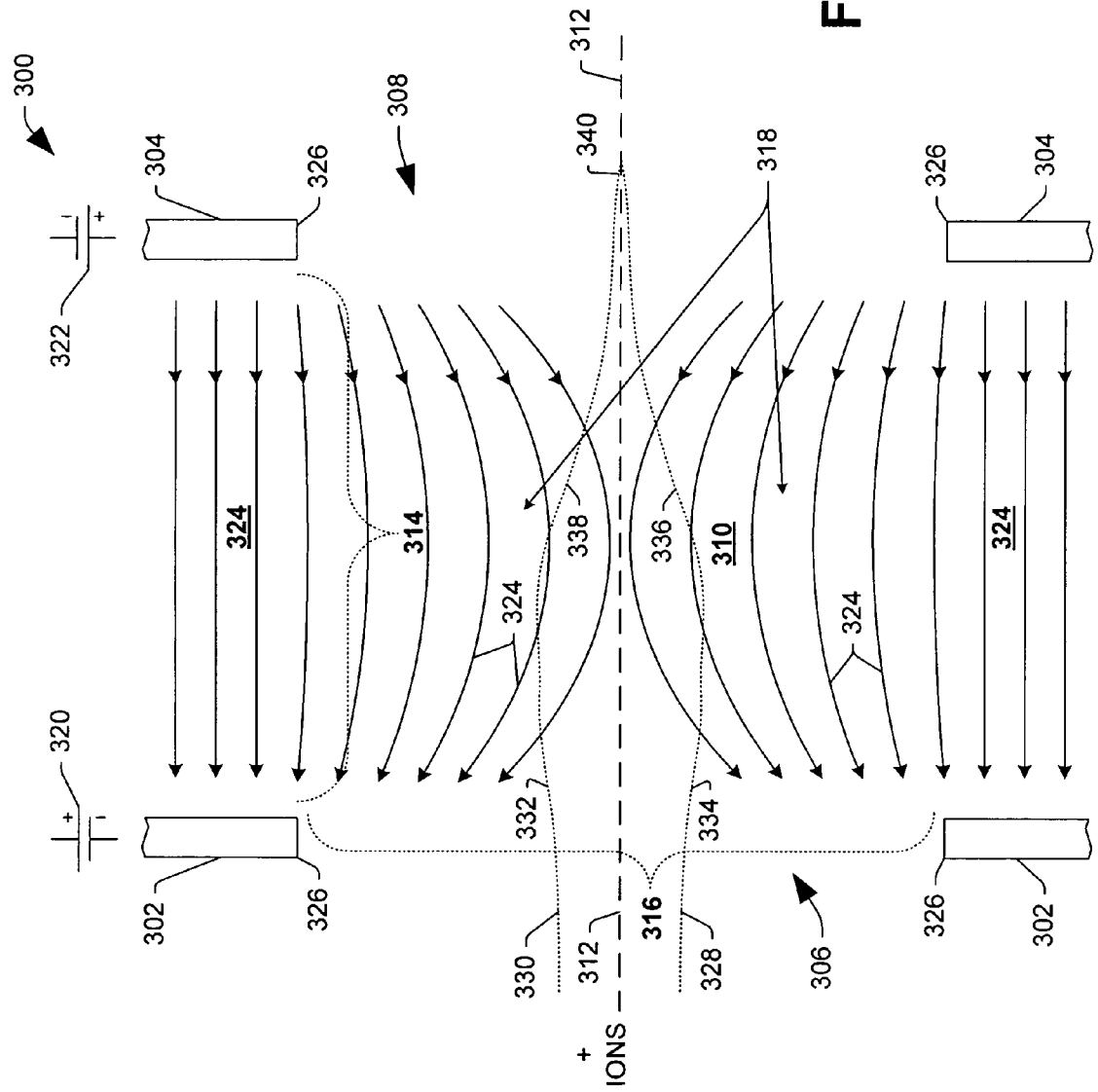
FIG. 3 is an illustration depicting focusing effects of electrodes in a deceleration mode according to one or more aspects of the present invention.
Figure 4:
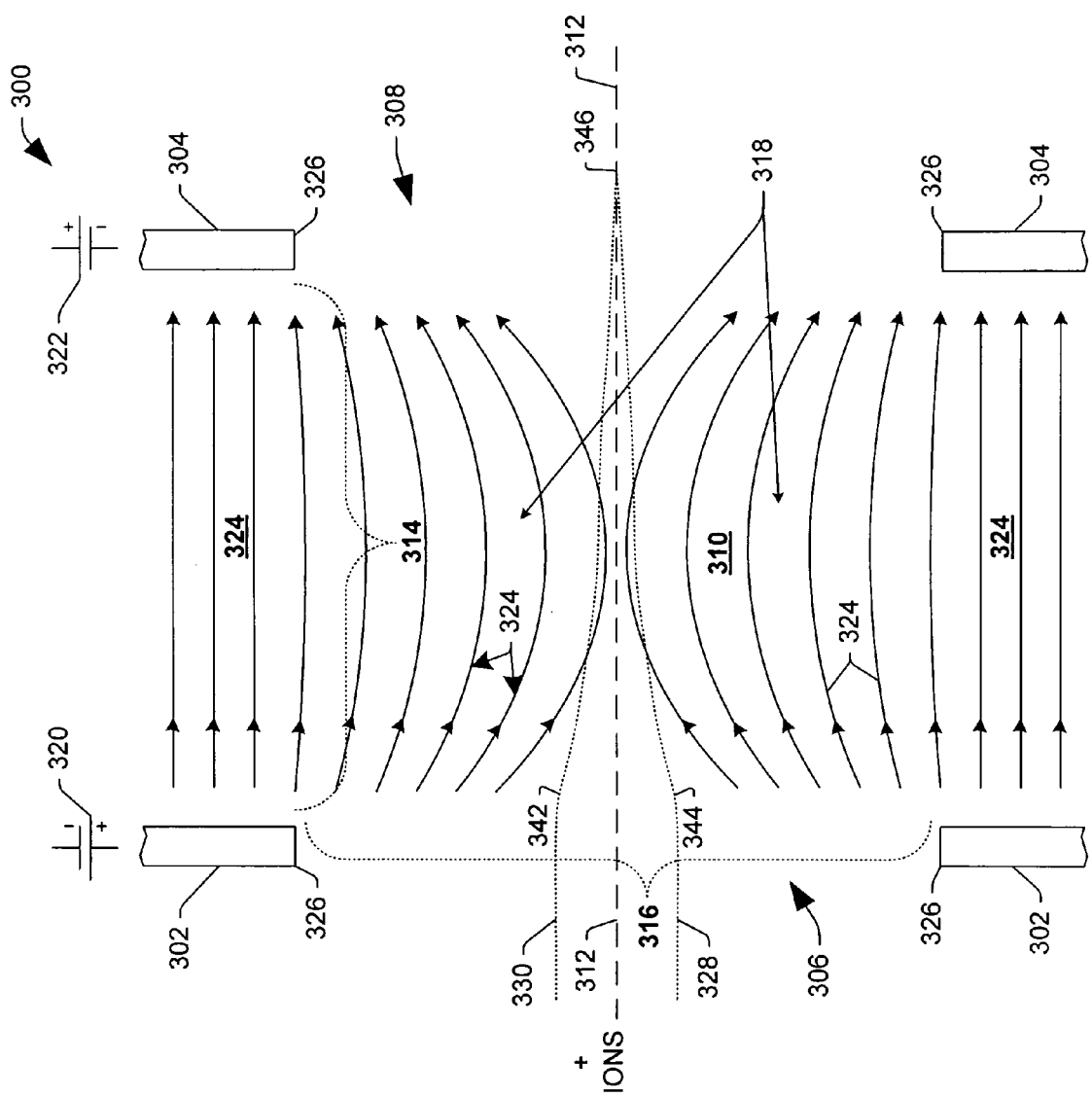
FIG. 4 is an illustration depicting focusing effects of electrodes in an acceleration mode according to one or more aspects of the present invention.

FIGS. 3 and 4, discussed below, illustrate focusing properties of exemplary electrodes in accordance with the present invention. They are provided to facilitate a better understanding of the invention by describing focusing and accelerating properties of an exemplary pair of electrodes. FIG. 3 is a diagram illustrating ion beam focusing properties of a pair of electrodes 300 that decelerate an ion beam in accordance with one or more aspects of the present invention. First 302 and second 304 electrodes are provided which have first 306 and second 308 apertures formed therein, respectively. The first 302 and second 304 electrodes are substantially parallel to one another, and the apertures 306, 308 define a gap 310 between the electrodes 302, 304 through which an axis 312 substantially normal to the electrodes 302, 304 may pass so as to intersect the first 306 and second 308 apertures. The gap 310 has a width 314 substantially equal to the distance between the first 302 and second 304 electrodes, and a height 316 substantially equal to that of the first 306 and second 308 apertures. It will be appreciated, however, that the elements, features, components and/or items illustrated in the FIG. 3 (as well as in all of the other figures included herewith) may not be shown to scale nor with correct proportions relative to one another. By way of example, the gap 310 and apertures 306, 308 may be significantly magnified in FIG. 3 relative to their actual size.

In operation, an electrostatic field 318 is generated between the electrodes 302, 304 by applying different biases 320, 322 to the first 302 and second 304 electrodes. The apertures 306, 308 affect the electric field distribution because the internal electric field leaks through the apertures 306, 308. As such, field lines 324 bow out into the gap 310 as the electrostatic field curls around ends 326 of the electrodes 302, 304 which define the apertures 306, 308. It will be appreciated that in the example illustrated in FIG. 3, the electrodes 302, 304 are biased to decelerate ions passing through the gap 310 as the field lines are directed from the second electrode 304 to the first electrode 302 as indicated by the direction of the arrows on the field lines 324.

Two trajectories 328, 330 of ions in an ion beam passing though the gap are depicted in FIG. 3 to illustrate focusing effects. It will be appreciated that these trajectories are exemplary in nature and that trajectories of actual ions may differ from these trajectories 328, 330 somewhat. During deceleration, as the ions enter the gap 310 through the first aperture 306, the field lines 324 push the positive ions away from the axis 312 running through the gap 310. However, when the ions initially enter the gap 310, they still possess a great deal of energy and momentum as they have not been significantly decelerated. The field lines 324 thus have a small effect on the trajectories of the ions at this point and the ions are pushed away from the axis 312 only slightly as indicated at 332 and 334. As the ions continue through the gap, however, they are decelerated to a greater and greater degree and the field lines 324 thus have a greater affect on their respective trajectories. When the ions are approximately half way through the gap 310, the field lines 324 push the ions toward the axis 312 running through the gap 310 as indicated at 336 and 338. As the ions approach the second aperture 308, they have been significantly decelerated and have greatly reduced momentums. As a result, the field lines 324 affect their trajectories to a much greater degree causing them to converge towards the axis 310 as indicated at 340. The overall net effect, thus, is convergence or focusing of the ion beam. It will be appreciated that the amount of convergence illustrated in FIG. 3 may be exaggerated for purposes of illustration.

FIG. 4 is a diagram illustrating ion beam focusing properties of a pair of electrodes 300 that accelerate an ion beam in accordance with one or more aspects of the present invention. It will be appreciated that the overall net effect of ion beam focusing holds true where the ion beam is accelerated as well. This is illustrated in FIG. 4 where the first 302 and second 304 electrodes are biased such that the field lines 324 point in a direction from the first electrode 302 toward the second electrode 304 to accelerate ions thorough the gap 310. As ions enter the gap 310 through the first aperture 306, they are pushed in toward the axis 312 by the field lines 324 as indicted at 342 and 344. At this point they are pushed in rather significantly as the ions are initially moving rather slowly and have little momentum. As the ions continue to pass through the gap, however, they are continually accelerated and pick up increased momentum. As such, once the ions reach about the halfway point of the gap 310, the field lines have little affect on their trajectories as the ions speed through the gap 310 and out the second aperture 308. The overall net effect is thus once again convergence of the ion beam as indicated at 346, which may likewise be exaggerated for purposes of illustration.

Figure 5:
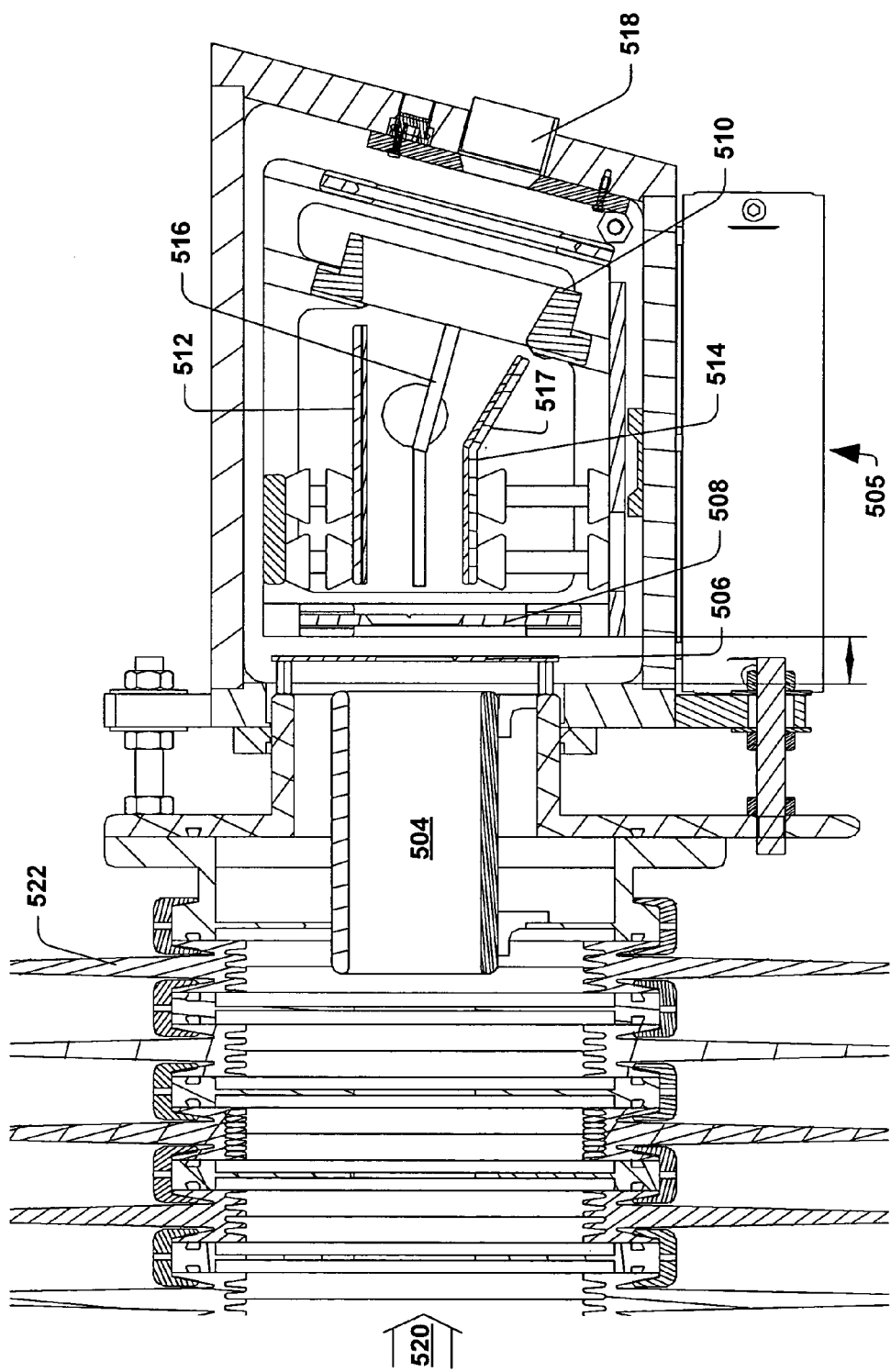
FIG. 5 is a diagram illustrating a horizontal cross sectional view of a beamline assembly in accordance with an aspect of the present invention.

FIG. 5 is a horizontal cross sectional view of a beamline assembly in accordance with an aspect of the present invention. The beamline assembly causes an incident ion beam to reduce its energy levels to a desired level, removes energy contaminants from the ion beam, and directs the ion beam toward a target (e.g., target wafer).

The beamline assembly comprises an acceleration component 502, a tube focus component 504, and an angular electrostatic filter 505. The acceleration component 502 comprises a number of stages that successively decelerate an incoming ion beam 520 as it travels through the component 502. The stages comprise electrodes arranged and biased to decelerate (or accelerate) ions. The tube focus component 504 is supported by insulators from the acceleration component 502, so that it can be biased independently to a negative potential that focuses the ion beam 520 in a vertical direction, and allows the ion beam to decelerate more but maintain an energy higher than the final energy by the potential of the tube focus voltage while the ions are substantially within component 504. The tube focus component 504 is rectangular in shape and is wider in the horizontal direction. A grounding plate 506 is present on the other side of the tube focus component 504 that terminates electric fields from the tube focus component 504.

The angular electrostatic filter 505 is operatively coupled to the tube component 504 and filters energy contaminants from the ion beam. The angular electrostatic filter 505 comprises an entrance electrode 508, an exit electrode 510, a top deflection plate 512, a bottom deflection plate 514, an edge electrode 516, and an exit slit 518. The entrance electrode 508 and exit electrode 510 comprise apertures that permit passage of the ion beam there through. The top deflection plate 512 is parallel to a path of the ion beam and the bottom deflection plate 514 includes a first portion parallel to the path of the ion beam and the top deflection plate and an angled portion. The edge electrode 516 is positioned about halfway between the top deflection plate 512 and the bottom deflection plate 514. The exit slit 518 is located at an exit end of the filter 505 and permits selected ions of the ion beam to pass toward a target.

The entrance electrode 508 and the exit electrode 510 are operative to accelerate the ion beam into the deflecting region and decelerate the beam after the deflecting region. As a result, the entrance electrode 508 and the exit electrode 510 can improve beam bend angle accuracy. The entrance electrode 508 and the exit electrode 510 are therefore set to a deflection bias value (as will be discussed in greater detail infra), but can also be set to other values. The top deflection plate 512 and the bottom deflection plate 514 operate as an electrode pair to desirably deflect selected ions, which comprise desired energy values, within the ion beam at a specific angle that permits them to pass through the exit slit 518. Energy contaminants, including neutral contaminants, do not bend or do not bend at the specific angle and, as a result, do not pass through the exit slit 518 and/or a more limiting slit closer to the target. The angled portion of the bottom deflection plate 514 facilitates proper deflection of the selected ions so that a relatively large beam can bend to the desired path without hitting the bottom plate. The exit slit 518 is typically biased to 0 V or ground, which causes the beam to decelerate after passing the exit focus electrode 510. The beam is decelerating to the final energy as it exits the fields of the deflecting plates 512 and 514 and the exit focus electrode 510. It is also completing the bend of the deflection. There are only short segments of these trajectories in which ions can be neutralized while at higher potentials and still have completed the bend enough to pass through blocking slits. This shorter path mitigates the possibility of neutral ions heading towards the target compared to conventional devices, which have a significant drift distance at a constant energy preceding the decel gap.

A top deflection voltage is applied to the top deflection plate 512 and a bottom deflection voltage is applied to the bottom deflection plate 514 thereby causing an electric field to develop there between. These voltages can be of equal magnitude with the top plate positive and bottom plate negative voltages. Alternatively, both plates can be operated at negative potentials by using a negative bias voltage. Generally, the bottom deflection voltage is more negative than the top deflection voltage. The deflection bias value is the average of the top deflection voltage and the bottom deflection voltage. Typically, the edge electrodes 516 are set to the deflection bias value voltage. As a result, the edge electrodes 516 mitigate edge effects associated with the finite width of the deflection plates, in other words they mitigate undesired deflection of the ion beam by reducing field penetration at the ends of the plates.

The voltages applied to the tube focus component 504 and the top and bottom deflection plates 512 and 514 can allow the ion beam to maintain a higher energy than it will have once it fully decelerates to ground potential to mitigate space charge forces while in the presence of the generated electrostatic fields. The ion beam is generally stripped of neutralizing electrons by the generated electrostatic fields. As a result, energy is employed to reduce the perveance of the ion beam.

The following description provides exemplary values and settings for a typical operation of the beamline assembly in order to facilitate a better understanding of the present invention. It is appreciated that the present invention is not limited to the exemplary values and settings described below. As an example of normal operation, the ion beam 520 enters the acceleration component 502 after a mass analyzer (not shown) with a relatively high energy level of 53.36 keV. The stages of the acceleration component 502 successively reduce the energy level or decelerate the ion beam 520. A final stage 522 of the acceleration component is at about −10.5 kV, which decelerates the ion beam 520 to an energy level of about 11.5 keV.

The tube focus component 504 is set to about −5 kV, which causes the energy level of the ion beam 520 to drop further, but not to ground potential so that the beam energy stays somewhat elevated at 6 keV within this electrode and also focuses the ion beam 520 in the vertical direction. In this example, the edge electrode 516, the entrance electrode 508, and the exit electrode are set to the deflection bias, which is −3.5 kV. The bottom plate 514 is set to a voltage of −5 kV and the top deflection plate 512 is set to a voltage of −2 kV, which causes selected ions within the ion beam 520 to deflect at a desired angle toward the bottom deflection plate 514 and ultimately pass through the exit slit 518. The exit slit 518 is at a potential of 0 V, which results in the ion beam dropping to a final energy level of 1 keV, in this example.

Figure 6:
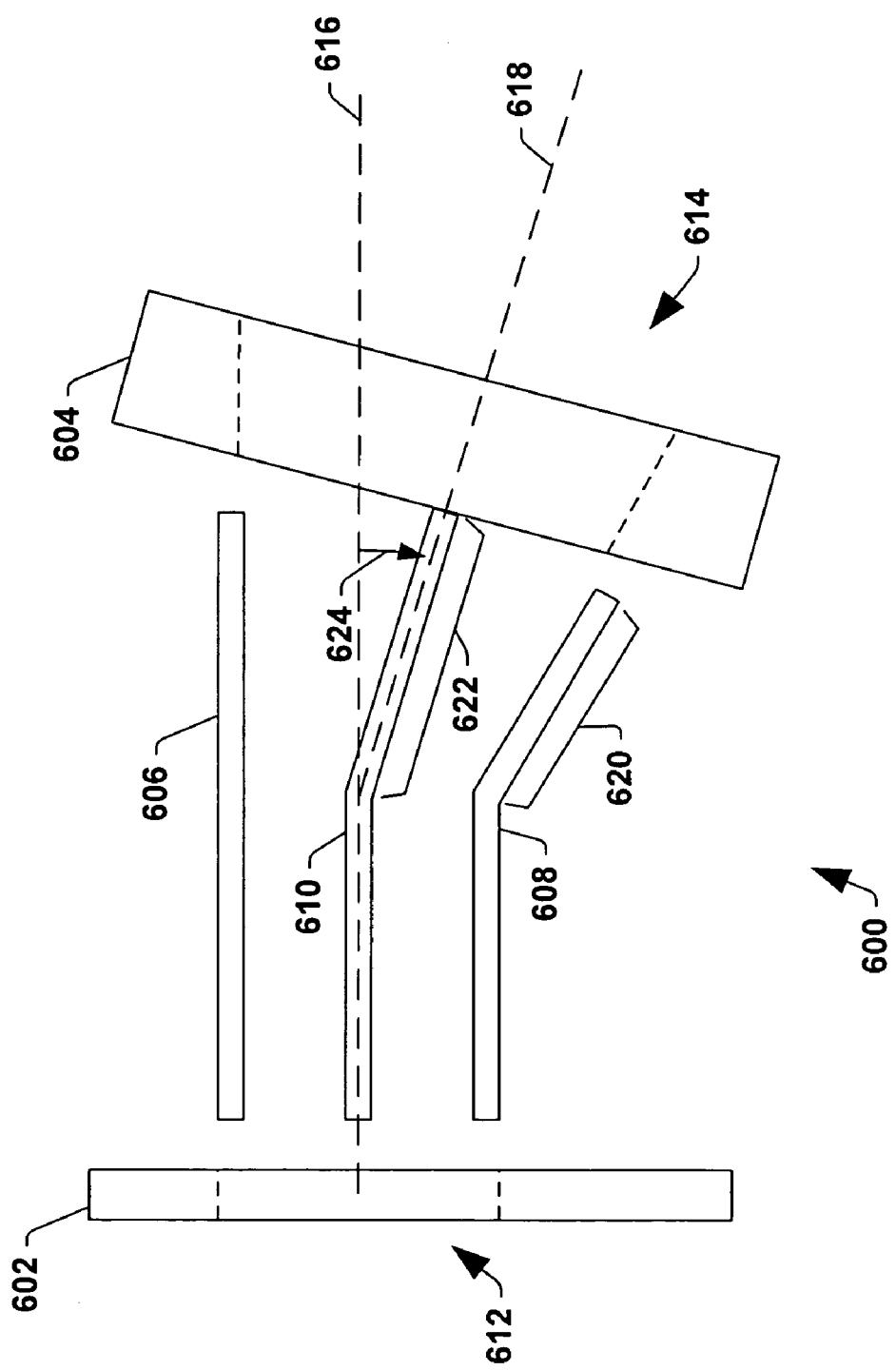
FIG. 6 is a diagram illustrating a horizontal, side view of an angular electrostatic filter in accordance with an aspect of the present invention.

FIG. 6 is a simplified horizontal, side view 600 of an angular electrostatic filter in accordance with an aspect of the present invention. The filter removes energy contaminants, including neutral contaminants, from an ion beam while causing ions having selected energies to deflect at a particular angle towards a target or target workpiece.

The angular electrostatic filter includes an entrance focus electrode 602, an exit focus electrode 604, a top deflection plate 606, a bottom deflection plate 608, and an edge electrode 610 (one for each side of a ribbon shaped ion beam). The entrance focus electrode 602 is positioned on an entrance side of the filter and mitigates edge focus effects and focuses an incoming ion beam. The entrance focus electrode 602 is relatively thin due to its relatively small aperture 612 that permits passage of the incoming ion beam. The exit focus electrode 604 is positioned on an exit side of the filter and also mitigates edge focus effects and re-focuses the ion beam as it is exiting the filter. The exit focus electrode 604 is relatively thick in order to ensure that a negative potential is achieved along the desired path or axis 618. The top deflection plate 606 is parallel to an initial path or axis 616 of the ion beam and extends from the entrance side of the filter to the exit side of the filter. The bottom deflection plate 606 is also substantially parallel to the initial path 616, but has an angled portion 620 that deflects away from the path 616. The edge electrodes 610 extend from the entrance focus electrode 602 to the exit focus electrode 606 and mitigate edge focus effects.

During operation, an ion beam enters the entrance electrode 602 through the aperture 612 along the path or axis 616. The top deflection plate 606 and the bottom deflection plate 608 generate an electric field generally extending from the top deflection plate 606 toward the bottom deflection plate 608. This field causes positively charged ions to deflect towards the bottom deflection plate 608. Generally, selected ions or ions having a selected energy deflect at a selected angle 624. Other ions, ions with non-selected energies, are deemed energy contaminants and deflect at other angles or fail to deflect. For example, neutral energy contaminants are not affected by the energy field and continue to travel along the original path or axis 616.

The angled portion 620 of the bottom deflection plate 608 facilitates a controlled deflection of the selected ions by shaping the electric field, discussed below, to reduce a path length for the ion beam that is susceptible to energy contamination. The entrance electrode 602 and the exit electrode 604 are typically set to a deflection plate bias, which is an average of the voltages applied to the top deflection plate 606 and the bottom deflection plate 606. However, the entrance electrode 602 and the exit electrode 604 can be set to other voltages according to desired beam shaping properties. Generally, the entrance electrode 602 and the exit electrode 604 facilitate shaping and focusing of the ion beam by causing the electric field to be more uniform. The edge electrode 610, which also includes an angled portion 622, follows the desired path 618 of the selected ions and reduces edge effects and is also typically set to the deflection plate bias.

The bottom deflection plate 608 is set to a bottom voltage and the top deflection plate 606 is set to a top voltage. Generally, the bottom voltage is more negative than the top voltage in order to attain the selected angle of deflection 624. The magnitude of the difference between the bottom voltage and the top voltage relates to the strength of the generated electric field. As a result, a larger magnitude between the top and bottom voltages yields a greater electric field and, therefore, a greater deflection angle.

Figure 7:
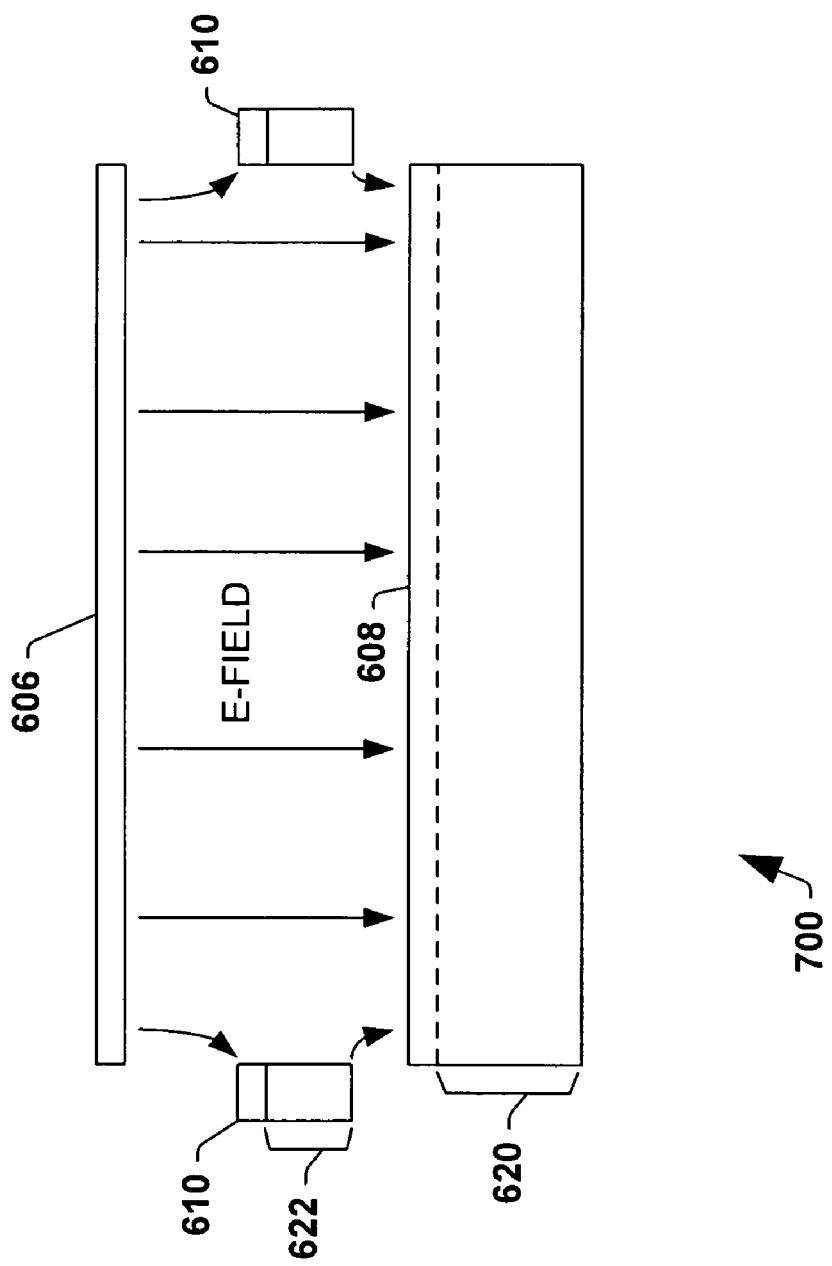
FIG. 7 is a diagram illustrating a side view of an angular electrostatic filter in accordance with an aspect of the present invention.

FIG. 7 is a side view 700 of the angular electrostatic filter of FIG. 6 in accordance with an aspect of the present invention. This view 700 more clearly shows the edge electrodes 610 and is presented as viewed from the exit end of the angular electrostatic filter. The components shown in FIG. 7 are described more fully with respect to FIG. 6.

Here, the edge electrodes 610, the top deflection plate 606, and the bottom deflection plate 608 are shown. The entrance focus electrode 602 and the exit focus electrode 604 are not shown so as to further illustrate the present invention. An angled portion 620 of the bottom deflection plate 608 and an angled portion 622 of the edge electrodes 610 can be seen in this view. It is noted that the width of the angular electrostatic filter is larger than its height in order to accommodate ribbon shaped ion beams.

Figure 8:
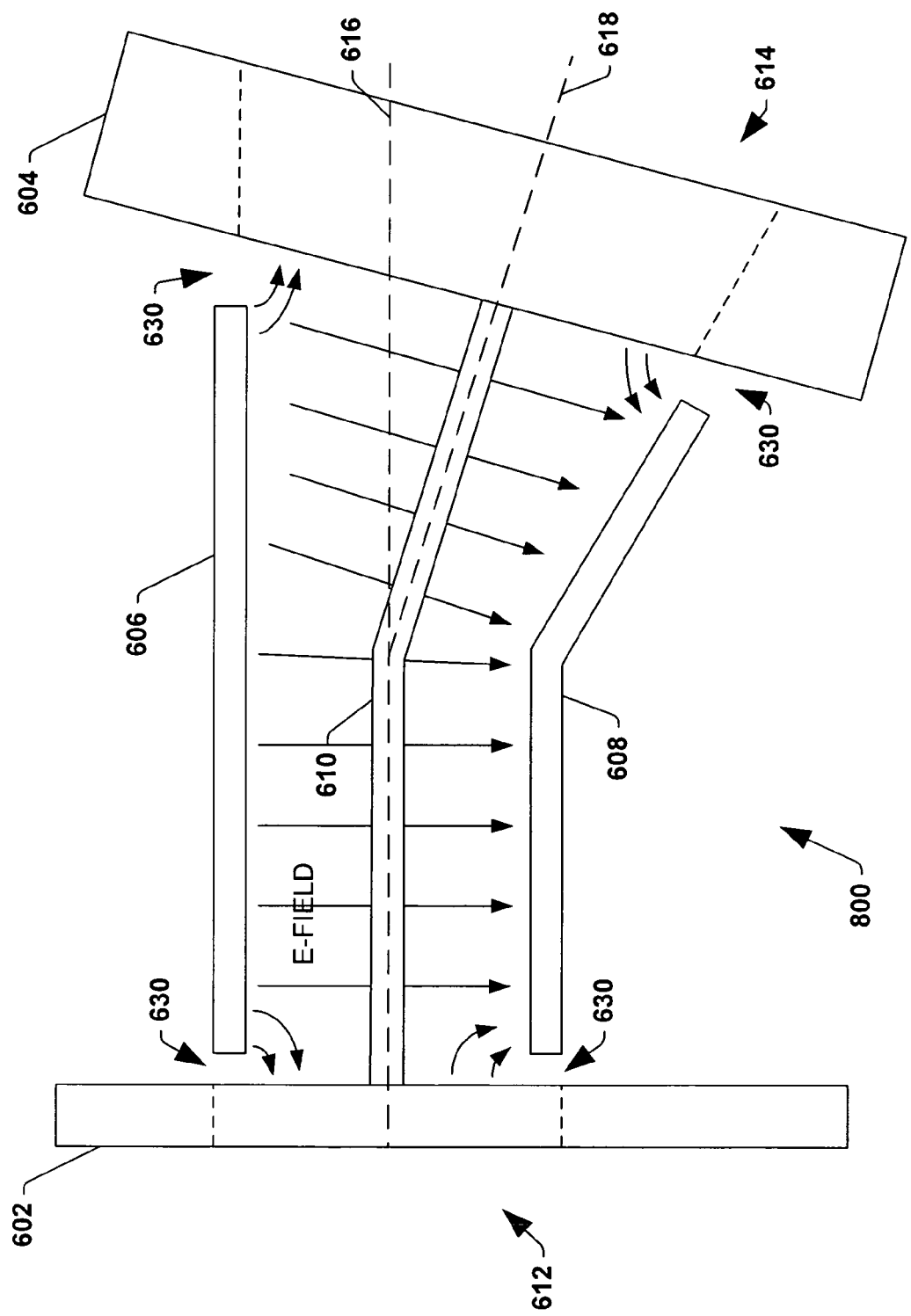
FIG. 8 is a diagram illustrating another horizontal, side view of an angular electrostatic filter in accordance with an aspect of the present invention.

FIG. 8 is another horizontal, side view 800 of an angular electrostatic filter in accordance with an aspect of the present invention. The filter removes energy contaminants, including neutral contaminants, from an ion beam while causing ions having selected energies to deflect at a particular angle towards a target or target wafer. This view 800 depicts electrostatic fields that may be generated during operation of the angular electrostatic filter.

An infinitely long pair of parallel plates can, with different voltages applied, generate an electric field that is uniformly orthogonal to the planes of the parallel plates. However, angular electrostatic filters are unable to employ infinitely long plates and are, therefore, susceptible to fringe or edge effects near edges of the top and bottom deflection plates 606 and 608 as shown at 630. The entrance electrode 602, the exit electrode 604, and the edge electrodes 610 are biased so as to mitigate these fringe or edge effects and generate a more uniform electric field. Additionally, the entrance electrode 602 and the exit electrode 604 can be employed to focus the ion beam in the vertical dimension as discussed supra. The exit electrode 604 is substantially thicker than the entrance electrode 602 because its aperture 614 is substantially larger than the aperture 612 of the entrance electrode 602.

Figure 9:
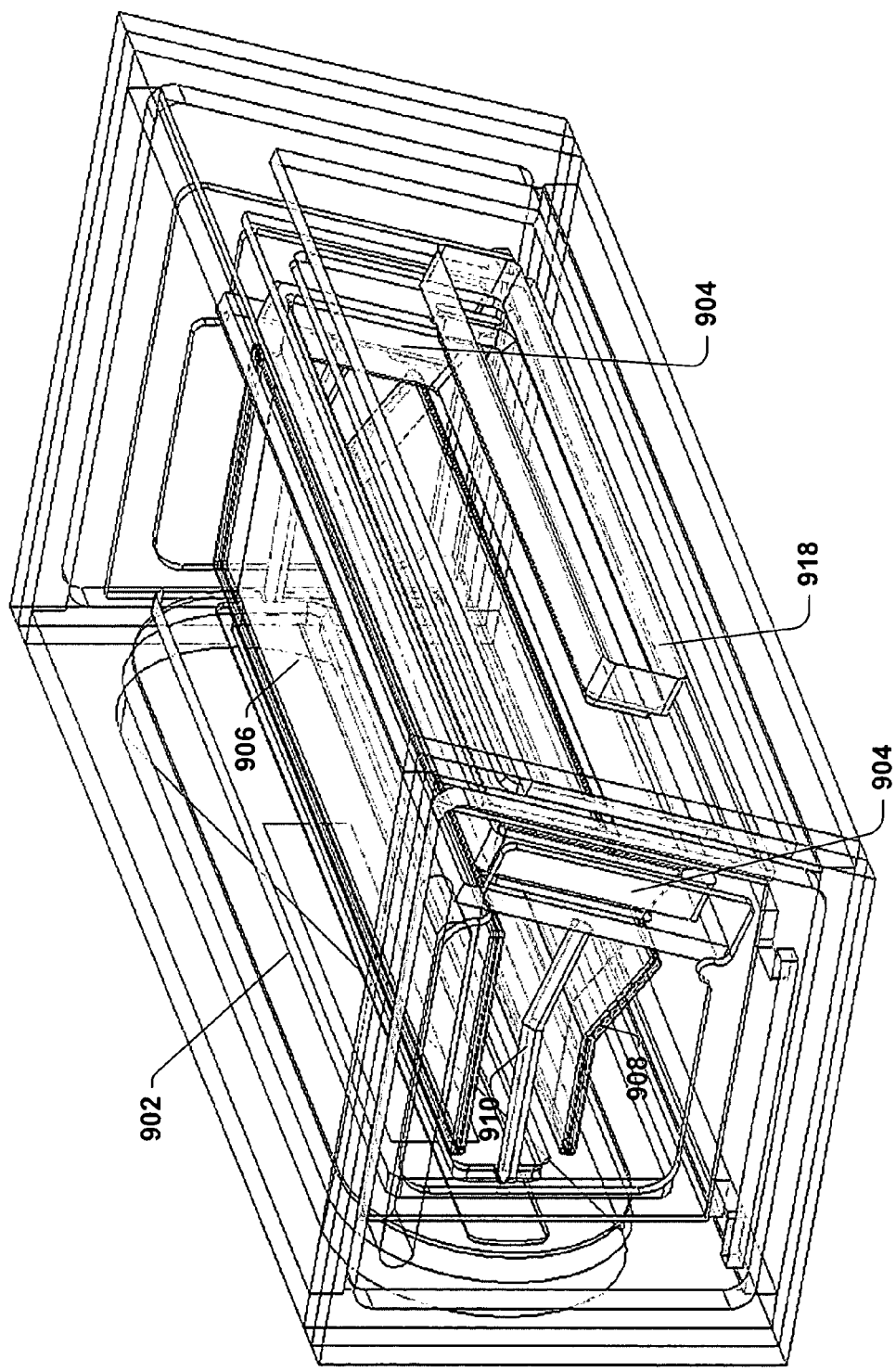
FIG. 9 is a diagram illustrating a perspective view of an angular electrostatic filter in accordance with an aspect of the present invention.

FIG. 9 is a perspective view of an angular electrostatic filter 900 in accordance with an aspect of the present invention. This view is presented to more clearly illustrate an exemplary arrangement of components within the angular electrostatic filter 900. It is appreciated that this filter 900 is exemplary in nature and that the present invention contemplates filters with other arrangements, configurations, spacings, and the like. The filter 900 removes energy contaminants, including neutral contaminants, from an ion beam while causing ions having selected energies to deflect at a particular angle towards a target or target wafer. Operation of the components within the filter 900 is generally as described above.

The angular electrostatic filter includes an entrance focus electrode 902, an exit focus electrode 904, a top deflection plate 906, a bottom deflection plate 908, an edge electrode 910 (one for each side of a ribbon shaped ion beam), and an exit slit 918. During operation, an ion beam enters an entrance side of the filter 900 through the entrance electrode 902 via an aperture 912 within the entrance electrode 902. The top deflection plate 906 and the bottom deflection plate 908 generate an electric field generally extending from the top deflection plate 906 toward the bottom deflection plate

908. This field causes positively charged ions to deflect towards the bottom deflection plate 908 at a vertex point about where an angled portion of the bottom deflection plate 908 begins. Generally, selected ions or ions having a selected energy deflect at a selected angle. Other ions, ions with non-selected energies, are deemed energy contaminants and deflect at other angles or fail to deflect. For example, neutral energy contaminants are not affected by the energy field and continue to travel along the original, line of sight path. The selected ions are deflected and pass through the exit slit 918 whereas the energy contaminants are not so deflected and fail to pass through the exit slit 918.

Figure 10:
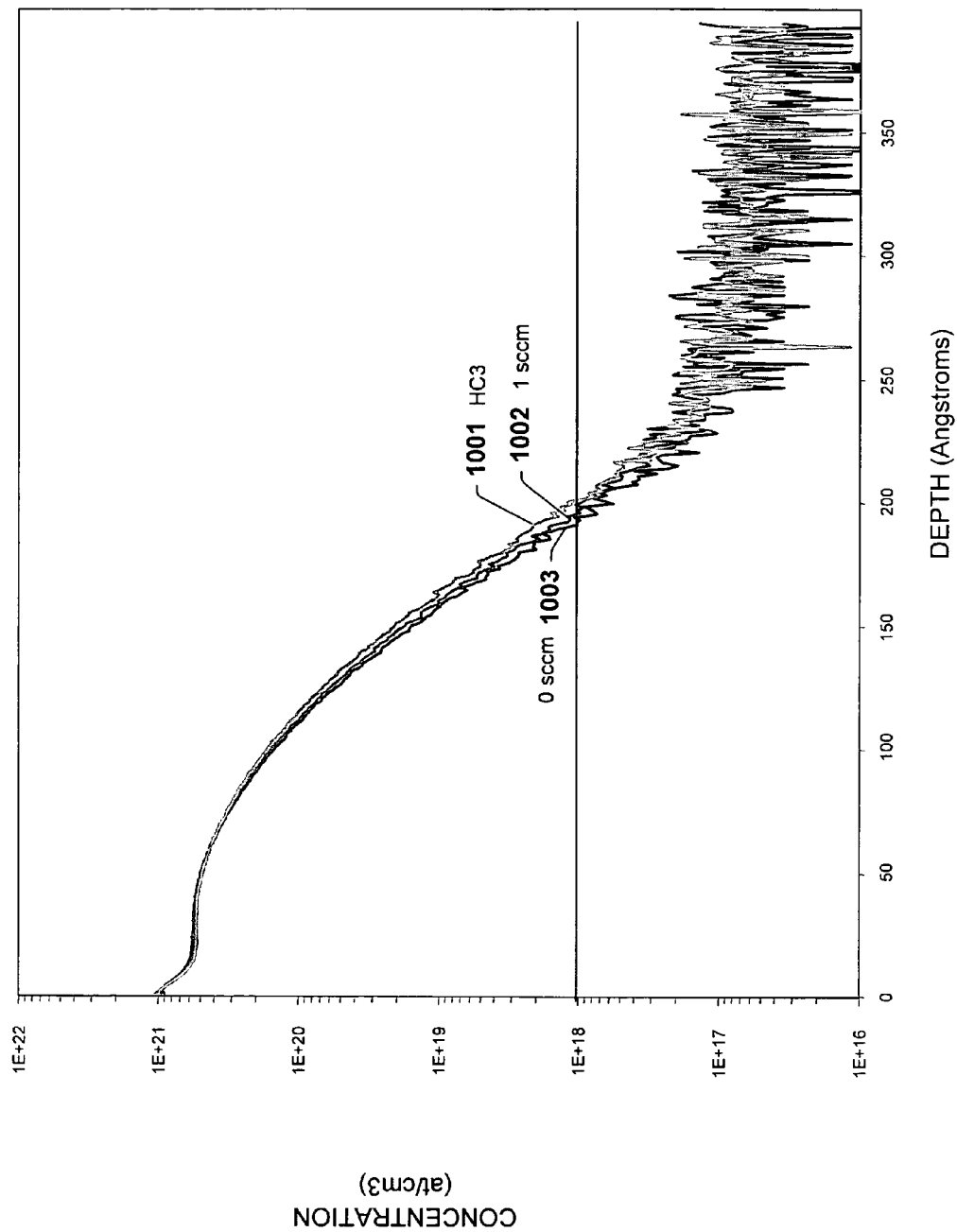
FIG. 10 is a graph illustrating exemplary energy contamination for ion implantation.

FIG. 10 is a graph illustrating exemplary energy contamination for ion implantation. The graph compares ion beams with varying levels of energy contamination, but filtered with an angular energy filter of the present invention. The graph was obtained using secondary ion mass spectroscopy (SIMS).

An x-axis depicts depth from a surface of a target wafer and a y-axis represents measured dopant concentration. The ion implantations performed to obtain the graph were 1 keV B+ implants. Potentials of −5 kV on the tube focus and −3.5 kV on the AEF bias and −5 kV on AEF focus electrodes might make one suspect that charge exchange within some of these potentials could lead to higher energy ions that could get to the wafer. However there is a relatively small fraction of the path length of the desired ions in which charge exchange can create a neutral that can get to the wafer with a higher energy. Line 1001 depicts measured dopant concentration for an ion implantation in which there is no risk of energy contaminants. Line 1002 depicts measured dopant concentrations for an ion implantation comprising 1 sccm Xe and subjected to biasing and line 1003 depicts measured dopant concentrations for an ion implantation subjected to biasing without added gas.

It can be seen from lines 1001, 1002, and 1003 that lines are similar. Accordingly, the intentional addition of Xe and/or biasing with the angular electrostatic filter do not introduce substantial amounts of energy contaminants.

In view of the foregoing structural and functional features described supra, methodologies in accordance with various aspects of the present invention will be better appreciated with reference to the above figures and descriptions. While, for purposes of simplicity of explanation, the methodologies described below are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 11:
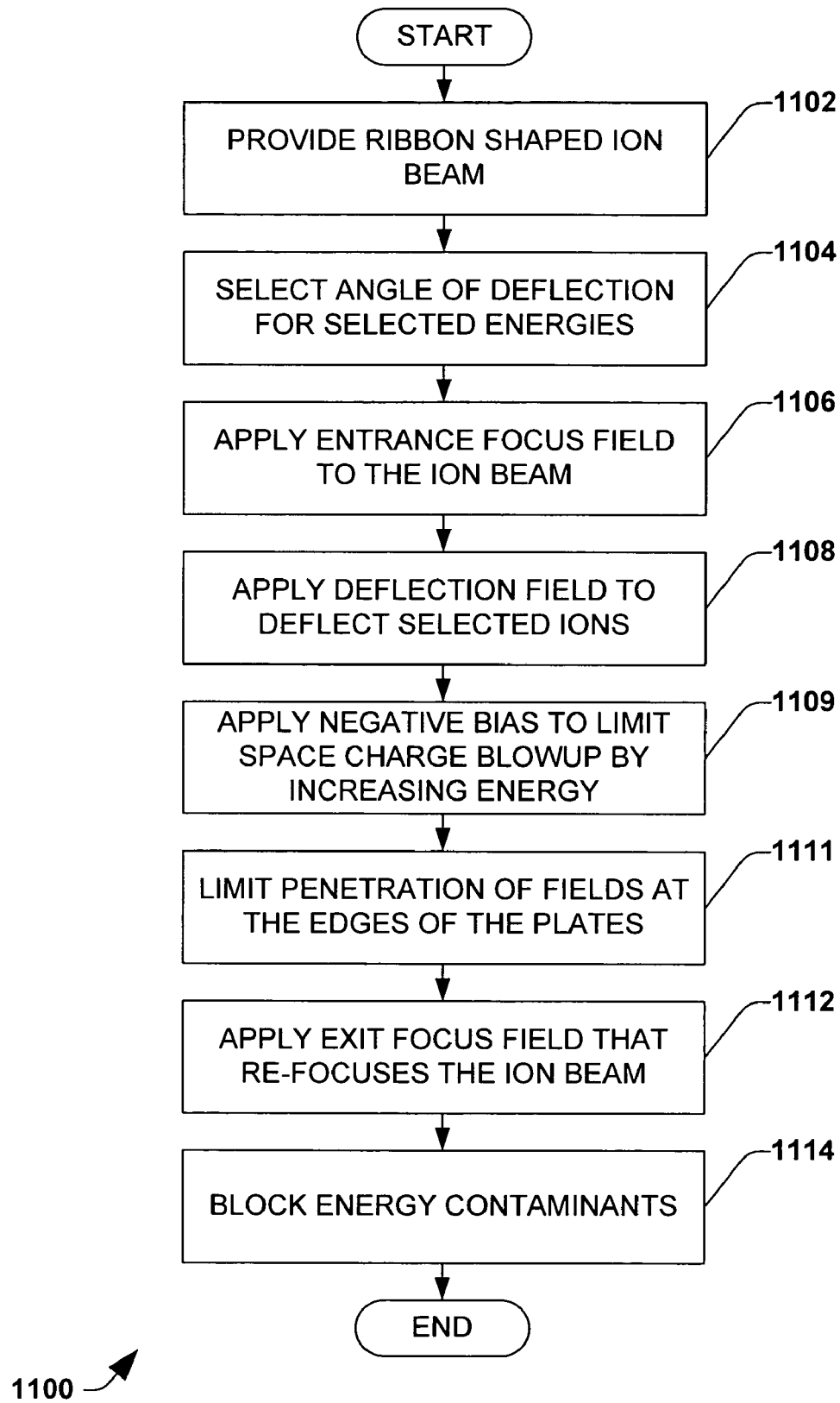
FIG. 11 is a flow diagram illustrating a method for removing energy contaminants from a ribbon shaped ion beam in accordance with an aspect of the present invention.

Referring now to FIG. 11, an exemplary methodology 1100 is illustrated for removing energy contaminants from a ribbon shaped ion beam in accordance with an aspect of the present invention. Although the methodology 1100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The method 1100 begins at block 1102, wherein a ribbon shaped ion beam is provided. The ion beam is relatively wide in a horizontal direction and relatively thin in a vertical direction. The method 1100 continues at block 1104, wherein an angle of deflection for a selected energy range of ions within the ion beam is selected. The selected energy range is dependent upon the ions to be employed in an implantation and are typically positive (e.g., B+ ions, $BF_2$+ ions, and the like). The angle of deflection can vary, but is typically a relatively small value (e.g., 15 to 25 degrees).

An entrance focus field is applied along a path of the ion beam that focuses the ion beam in a vertical dimension at block 1106. An entrance focus electrode comprising an aperture is typically employed to apply the entrance focus field. The ion beam path travels through the aperture.

Continuing at block 1108, a deflection field, which is substantially in the vertical direction, is applied to the ion beam according to the selected angle of deflection to deflect ions within the selected energy range at about the selected angle of deflection. Energy contaminants are generally not deflected (e.g., neutral contaminants) or at another angle. A negative voltage bias is superimposed on the deflection field by using negative voltage on the top deflection plate and a more negative voltage on the bottom deflection plate, wherein the ion beam travels between the top and bottom deflection plates. Space charge blowup of the ion beam is mitigated at block 1109. The negative bias potential applied to deflection plates allows the ion beam to maintain a higher energy while being deflected in the electrostatic field, which reduces space charge blow up of the ion beam. The negative bias potential can lead to undesirable edge focusing near each end of the top and bottom plate. This undesirable edge focusing is limited at block 1111 by applying a potential, nominally equal to the bias potential, to electrodes at the edge of the plates spaced along the middle of the gap between the top and bottom plates. Generally, edge electrodes, as discussed above, are employed to limit the undesirable edge focusing near each end of the top and bottom plate.

An exit focus field that focuses the ion beam in a vertical direction is applied to the ion beam after applying the deflection field at block 1112. The exit focus field is applied by using an exit focus electrode with an aperture that permits passage of the ion beam through the aperture. Subsequently, energy contaminants are blocked while the ions deflected at about the selected angle pass through toward a target wafer at block 1114. A block or piece of material can be employed to absorb the energy contaminants while an exit slit has an opening that permits passage of the ion beam towards the target wafer.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention may include a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. An angular electrostatic filter comprising:
   a top deflection plate set to a top voltage extending from an entrance side to an exit side, wherein the top deflection plate is planar;
   a bottom deflection plate wherein at least a portion is substantially parallel to the top deflection plate and at least a portion is angled with respect to the top deflection plate, extending from the entrance side to the exit side, and set to a bottom voltage, wherein the bottom voltage is more negative than the top voltage, and wherein an electric field is generated between the top deflection plate and the bottom deflection plate;
   an entrance electrode positioned at the entrance side of the filter and set to a first focus voltage; and
   an exit electrode positioned at the exit side of the filter, wherein the exit electrode is set to a second focus voltage.

2. The filter of claim 1, wherein the first focus voltage and the second focus voltage are set to an average of the bottom voltage and the top voltage.

3. The filter of claim 1, wherein the electric field causes ions having a selected energy to deflect by a particular angle.

4. The filter of claim 3, further comprising an exit slit downstream of the exit electrode, wherein the ions deflected by the particular angle pass through the exit slit.

5. The filter of claim 1, wherein the entrance electrode focuses an ion beam entering through the filter and shapes the electric field near the entrance side of the filter.

6. The filter of claim 1, wherein the exit electrode focuses an ion beam exiting the filter and shapes the electric field near the exit side of the filter.

7. The filter of claim 1, wherein the top voltage is a negative value, the bottom voltage is a more negative value, and an average of the top voltage and the bottom voltage is a negative value.

8. The filter of claim 1, wherein the bottom deflection plate comprises an angled portion.

9. The filter of claim 8, further comprising a pair of edge electrodes extending from the entrance electrode to the exit electrode, set to an edge focus value, is substantially parallel to the top and bottom deflection plates, includes an angled portion and mitigates field penetration.

10. A beamline assembly comprising:
    an accelerator component that selectively decelerates a ribbon shaped incoming ion beam;
    a tube focus component that further decelerates the ion beam and focuses the ion beam in a vertical direction; and
    an angular electrostatic filter that removes energy contaminants from the ion beam and directs the ion beam toward a target, wherein the angular electrostatic filter comprises:
      a top deflection plate extending from an entrance side to an exit side, wherein the top deflection plate is planar;
      a bottom deflection plate having a non-angled portion substantially parallel to the top deflection plate, extending from the entrance side toward the exit side and an angled portion extending from the non-angled portion to the exit side;
      an entrance electrode having an aperture that permits passage of the ion beam positioned at entrance side of the filter;
      an exit electrode positioned having an aperture that permits passage of the ion beam positioned at the exit side of the filter;
      a pair of edge electrodes extending from the entrance side to the exit side, substantially parallel to the top deflection plate and positioned midway between the top deflection plate and the bottom deflection plate; and
      an exit slit positioned downstream of the exit electrode that blocks energy contaminants and permits passage of ions having selected energies.

11. The assembly of claim 10, wherein the tube focus voltage is negative and allows the beam to decelerate but still maintain a higher energy than a final energy while within the angular electrostatic filter.

12. The assembly of claim 10, wherein a negative bias voltage is applied across the top and bottom deflection plates that causes the ion beam to maintain a somewhat higher energy than a final energy while between the top and bottom deflection plates.

13. The assembly of claim 12, wherein the pair of edge electrodes are set to the bias voltage to mitigate edge fringe field affects.

14. The assembly of claim 13, wherein the entrance electrode is set to the bias voltage.

15. The assembly of claim 10, wherein the angled portion of the bottom deflection plate comprises about half of the bottom deflection plate near the exit side of the filter and at an angle away from the top deflection plate.

16. The assembly of claim 15, wherein the angled portion of the bottom plate is at an angle of about twice a bend angle of the beam.

17. A method of removing energy contaminants form a ribbon shaped ion beam comprising:
    selecting an angle of deflection for a selected energy range for the ribbon shaped ion beam;
    applying an entrance focus field that focuses the ion beam in a vertical direction;
    applying an edge field that mitigates non-uniform fields near an end of a deflection field; and
    applying the deflection field according to the selected energy range at the selected angle of deflection, wherein applying the deflection field comprises applying a negative bias across a planar top deflection plate and a bottom deflection plate having an angled portion and a planar portion, wherein the ion beam travels between the top and bottom deflection plates, wherein the planar portion is parallel to the top deflection plates an is located at an entrance side of the deflection field.

18. The method of claim 17, further comprising applying an exit focus field that focuses the ion beam in a vertical direction after applying the deflection field.

19. The method of claim 17, further comprising blocking energy contaminants after applying the deflection field.

* * * * *

UNITED STATES PATENT AND TRADEMARK OFFICE
CERTIFICATE OF CORRECTION

| | | |
|---|---|---|
| PATENT NO. | : 7,022,984 B1 | Page 1 of 1 |
| APPLICATION NO. | : 11/047238 | |
| DATED | : April 4, 2006 | |
| INVENTOR(S) | : Robert D. Rathmell, Bo H. Vanderberg and Youngzhang Huang | |

It is certified that error appears in the above-identified patent and that said Letters Patent is hereby corrected as shown below:

Column 14, Claim 17, line 60: Please replace the first word "an" with the word --and--.

Signed and Sealed this

Twelfth Day of September, 2006

JON W. DUDAS
*Director of the United States Patent and Trademark Office*